(12) United States Patent
Tsuchiya et al.

(10) Patent No.: US 10,545,192 B2
(45) Date of Patent: Jan. 28, 2020

(54) ELECTRIC STORAGE MODULE

(71) Applicant: TAIYO YUDEN CO., LTD., Chuo-ku, Tokyo (JP)

(72) Inventors: Takayuki Tsuchiya, Takasaki (JP); Shinji Ishii, Takasaki (JP)

(73) Assignee: TAIYO YUDEN CO., LTD., Tokyo (JP)

(*) Notice: Subject to any disclaimer, the term of this patent is extended or adjusted under 35 U.S.C. 154(b) by 0 days.

(21) Appl. No.: 16/148,882

(22) Filed: Oct. 1, 2018

(65) Prior Publication Data

US 2019/0107583 A1    Apr. 11, 2019

(30) Foreign Application Priority Data

Oct. 11, 2017  (JP) .................. 2017-197446

(51) Int. Cl.
| | | |
|---|---|---|
| G01R 31/36 | (2019.01) | |
| H01G 11/78 | (2013.01) | |
| G01R 31/396 | (2019.01) | |
| H01G 11/76 | (2013.01) | |
| H01G 11/10 | (2013.01) | |
| H01G 11/08 | (2013.01) | |
| H01M 10/48 | (2006.01) | |
| H01M 10/0525 | (2010.01) | |

(52) U.S. Cl.
CPC .......... *G01R 31/396* (2019.01); *H01G 11/08* (2013.01); *H01G 11/10* (2013.01); *H01G 11/76* (2013.01); *H01G 11/78* (2013.01); *H01M 10/0525* (2013.01); *H01M 10/48* (2013.01)

(58) Field of Classification Search
USPC ........................................... 361/736
See application file for complete search history.

(56) References Cited

U.S. PATENT DOCUMENTS

| | | | | |
|---|---|---|---|---|
| 7,960,943 B2* | 6/2011 | Gamboa | ............. | H01M 2/0245 320/107 |
| 8,299,801 B2* | 10/2012 | Yano | .................... | H01M 2/1066 320/104 |
| 2004/0212342 A1* | 10/2004 | Batson | .................. | H02J 7/0047 320/107 |
| 2014/0017533 A1* | 1/2014 | Nishihara | ............... | H01M 2/06 429/93 |
| 2014/0335378 A1* | 11/2014 | Kuroda | ................. | H01M 2/206 429/7 |
| 2016/0035497 A1* | 2/2016 | Sengoku | ................ | H01G 11/10 429/90 |
| 2017/0212171 A1* | 7/2017 | Sejima | .................... | B60L 58/22 |
| 2018/0088179 A1* | 3/2018 | Ota | ...................... | H01R 12/592 |

FOREIGN PATENT DOCUMENTS

JP    2005203262 A    7/2005

* cited by examiner

*Primary Examiner* — Dimary S Lopez Cruz
(74) *Attorney, Agent, or Firm* — Law Office of Katsuhiro Arai (57) ABSTRACT

An electric storage module includes an electric storage cell, a voltage detection board, and a spacer. The electric storage cell has an electric storage element, as well as terminals electrically connected to the positive or negative electrodes of the electric storage element. The voltage detection board has a land and wiring provided on it. The spacer has electrical conductivity and contacts the terminal and the land.

5 Claims, 10 Drawing Sheets

ELECTRIC STORAGE MODULE

BACKGROUND

Field of the Invention

The present invention relates to an electric storage module constituted by electric storage cells.

Description of the Related Art

Electric storage cells such as lithium ion capacitors are expected to be used within the range between their upper-limit voltage and lower-limit voltage, and once outside this range, they generate gas and can no longer be charged and discharged in a stable manner with ease. For this reason, electric storage modules with built-in electric storage cells are constituted so that the voltages of the electric storage cells are monitored and controlled (refer to Patent Literature 1, for example).

To be specific, electric storage modules constituted by electric storage cells whose terminals are connected to a control board via cables to monitor and control the voltages of the electric storage cells, are common.

BACKGROUND ART LITERATURES

[Patent Literature 1] Japanese Patent Laid-open No. 2005-203262

SUMMARY

According to this constitution, however, an increase in the number of electric storage cells installed in the electric storage module increases the number of cables and makes the storing of cables complicated. In addition, while it is possible to press-fit pins into a bus bar which is connected to the electric storage cells and then solder these pins in contact with a control board, this approach requires accuracy of parts and presents a problem in that the pins press-fit into the bus bar make unstable contact.

In light of the aforementioned situations, an object of the present invention is to provide an electric storage module that allows for stable voltage detection and features a simple voltage detection structure.

Any discussion of problems and solutions involved in the related art has been included in this disclosure solely for the purposes of providing a context for the present invention, and should not be taken as an admission that any or all of the discussion were known at the time the invention was made.

To achieve the aforementioned object, the electric storage module pertaining to a mode of the present invention comprises an electric storage cell, a voltage detection board, and a spacer.

The electric storage cell has an electric storage element, as well as terminals electrically connected to the positive or negative electrodes of the electric storage element.

The voltage detection board has a land and wiring provided on it.

The spacer has electrical conductivity and contacts the terminal and the land.

According to this constitution, the terminals of the electric storage cell are electrically connected to the land via the spacer, to allow for voltage detection via the voltage detection board. Since the terminals of the electric storage cell need not be connected to wiring, etc., or soldered, voltage detection is possible based on a simple structure.

The electric storage module may further have a voltage detection board holder that has insulation property, is placed between the terminal and the voltage detection board, and has an opening, and the spacer may contact the terminal and land via the opening.

The electric storage module may have a screw that is inserted through the voltage detection board, spacer, voltage detection board holder, and terminal, to jointly secure the voltage detection board, spacer, voltage detection board holder, and terminal.

The electric storage module may have multiple electric storage cells, and multiple spacers may respectively contact the terminals provided in the electric storage cells as well as multiple lands.

The electric storage cell may be a lithium ion capacitor.

As described above, an electric storage module can be provided, according to the present invention, that allows for stable voltage detection and features a simple voltage detection structure.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DESCRIPTION OF THE SYMBOLS

100 - - - Electric storage module
120 - - - Electric storage cell

121 - - - Electric storage element
123 - - - Positive-electrode terminal
124 - - - Negative-electrode terminal
140 - - - First voltage detection unit
141 - - - Voltage detection board
141a - - - Hole
141b - - - Land
142 - - - Voltage detection board holder
143 - - - Spacer
144 - - - Screw
145 - - - Voltage detection board holder cover
150 - - - Second voltage detection unit

DETAILED DESCRIPTION OF EMBODIMENTS

The electric storage module pertaining to an embodiment of the present invention is explained.

[Constitution of Electric Storage Module]

Figure 1:
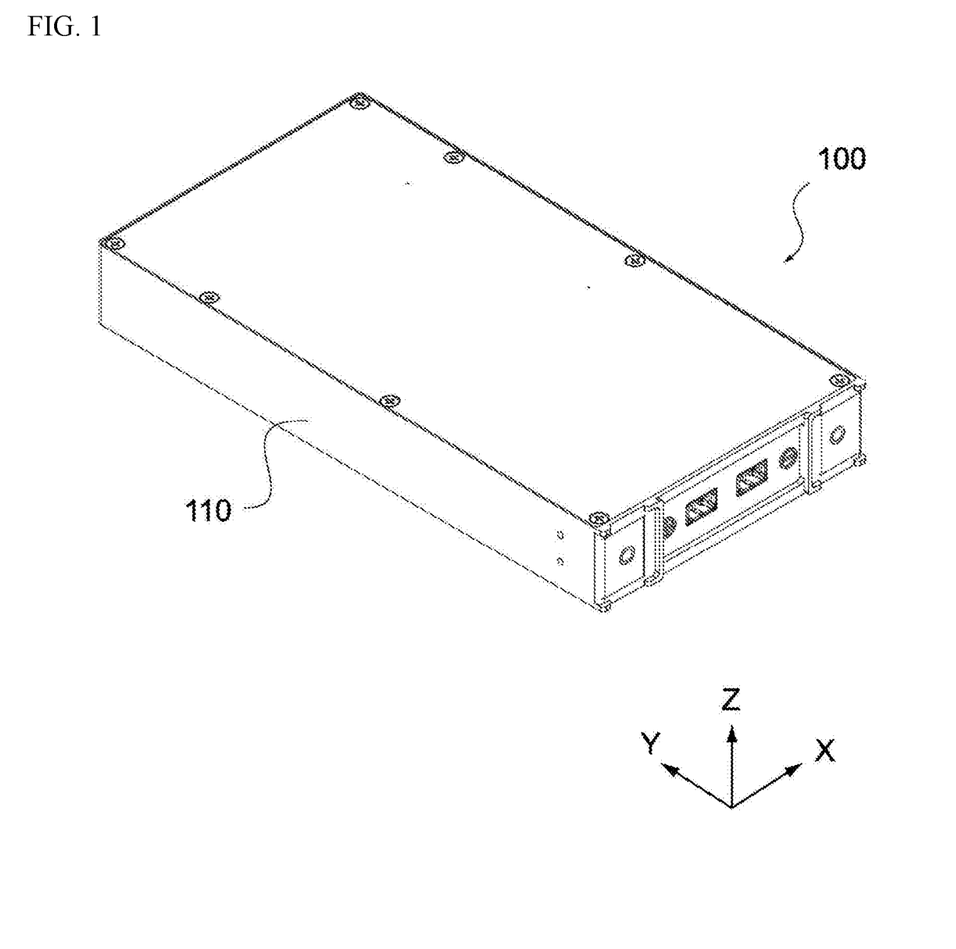
FIG. 1 is a perspective view of the electric storage module pertaining to an embodiment of the present invention.
Figure 2:
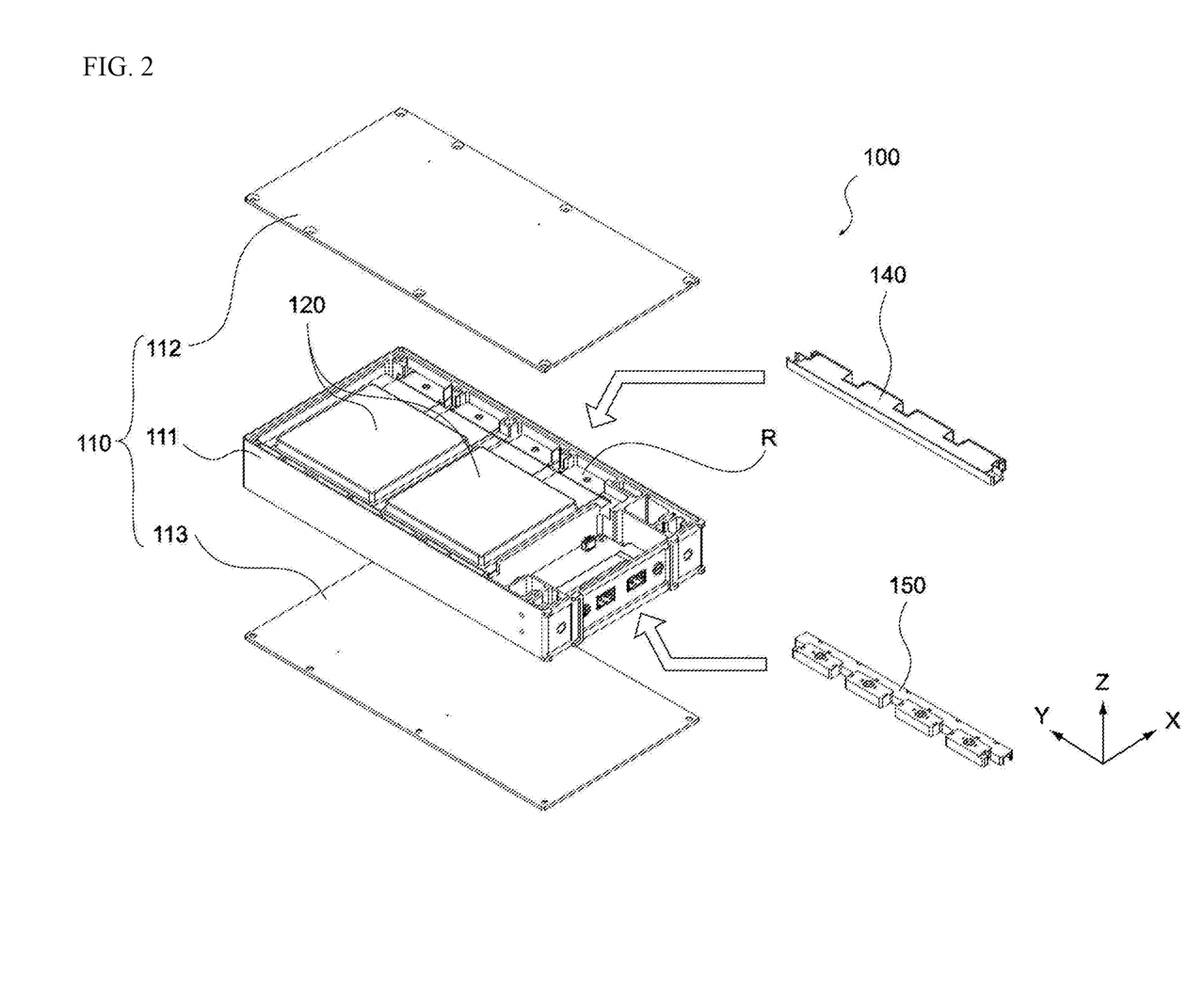
FIG. 2 is an exploded perspective view of the electric storage module.

FIG. 1 is a perspective view of the electric storage module 100 pertaining to this embodiment, while FIG. 2 is an exploded perspective view of the electric storage module 100. As shown in these figures, the electric storage module 100 comprises a housing 110, electric storage cells 120, a first voltage detection unit 140, and a second voltage detection unit 150. It should be noted that, in each of the figures below, the three directions that are crossing at right angles to each other represent the X direction, Y direction, and Z direction, respectively.

The housing 110 is constituted by a frame member 111, a first sheet member 112, and a second sheet member 113, as shown in FIG. 2.

The frame member 111 is a frame-shaped member made of synthetic resin, etc. Mounted on the frame member 111 are, for example, connectors that are electrically connected to the positive-electrode terminals and negative-electrode terminals of the electric storage cells 120, and a board on which control circuits for the electric storage cells 120 are installed.

The first sheet member 112 and second sheet member 113 are sheet-shaped members made of aluminum or other metal. As the first sheet member 112 and second sheet member 113 sandwich the frame member 111, a housing space R enclosed by the frame member 111, first sheet member 112, and second sheet member 113 is formed. The first sheet member 112 and second sheet member 113 are secured to the frame member 111 with screws, etc.

The housing 110 is not limited to the constitution illustrated herein; instead, it may be constituted in any way so long as a housing space in which the electric storage cells 120 can be housed is formed.

Figure 3:
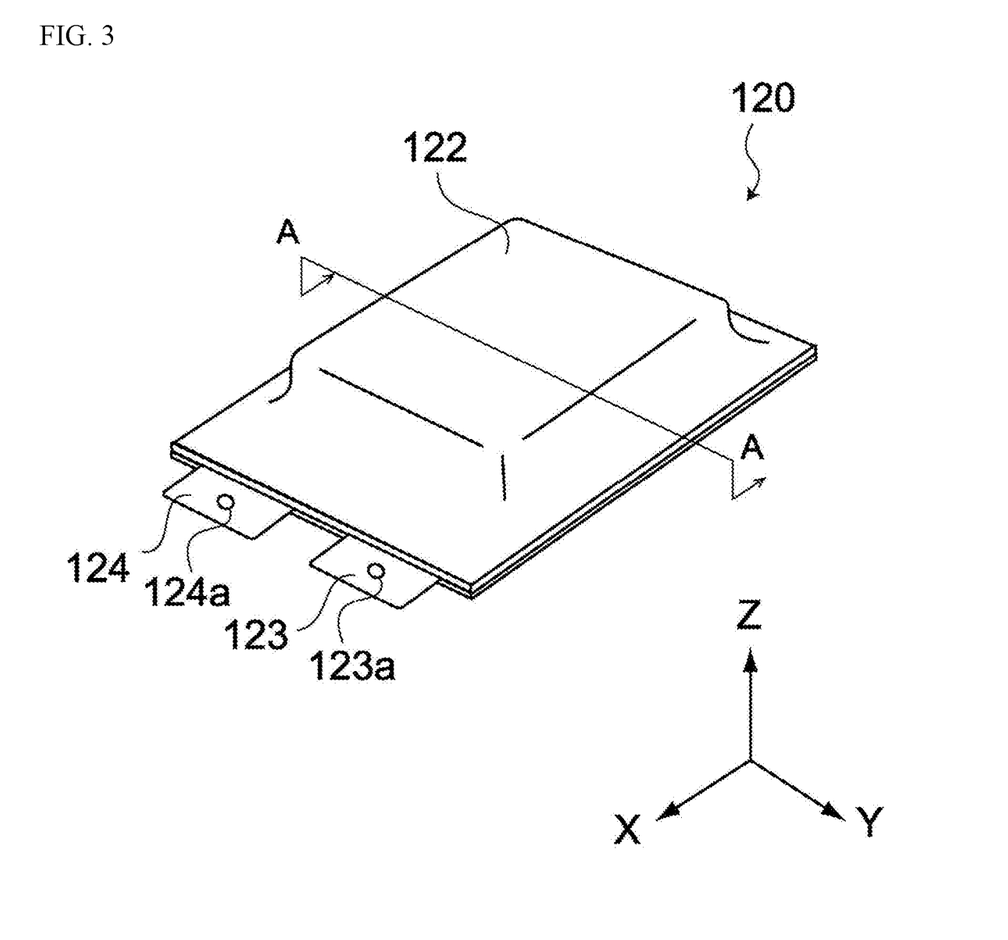
FIG. 3 is a perspective view of an electric storage cell provided in the electric storage module.
Figure 4:
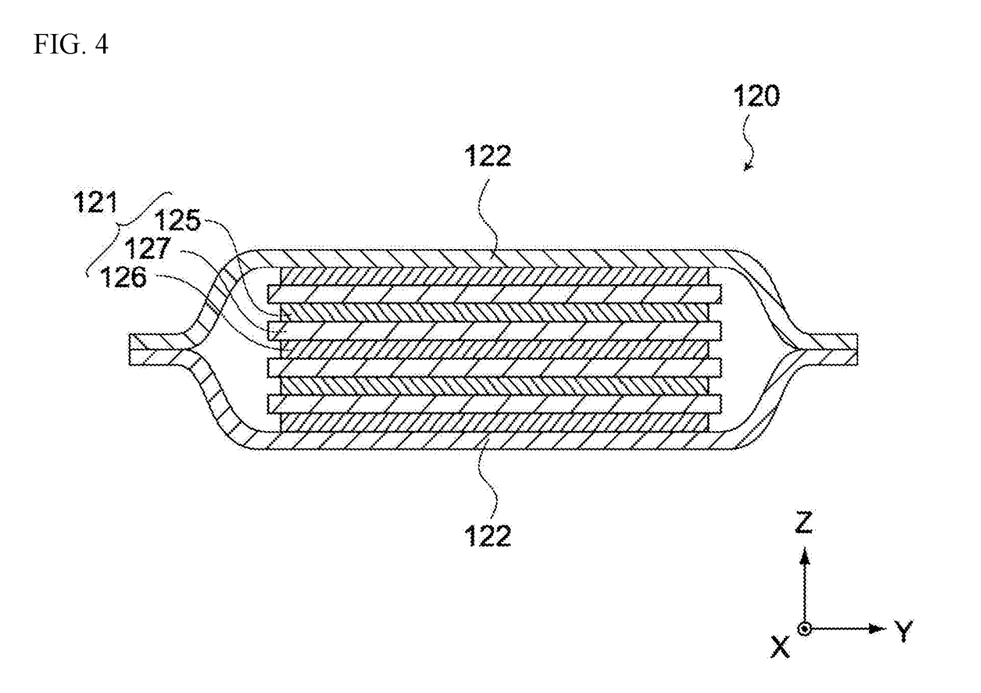
FIG. 4 is a cross-sectional view of an electric storage cell provided in the electric storage module.

The electric storage cells 120 are cells that can be charged and discharged. FIG. 3 is a perspective view of an electric storage cell 120. FIG. 4 is a cross-sectional view of an electric storage cell 120, showing a cross-section along line A-A in FIG. 3. As shown in these figures, the electric storage cell 120 has an electric storage element 121, exterior members 122, a positive-electrode terminal 123, and a negative-electrode terminal 124.

The electric storage element 121 is constituted by positive electrodes 125, negative electrodes 126 and separators 127 that are layered, as shown in FIG. 4.

The positive electrodes 125 are each a sheet-shaped member that contains positive electrode material, being a current-collecting foil layered with a positive-electrode material, for example. The current-collecting foil is a porous aluminum foil, for example, and the positive-electrode material is a mixture of activated carbon or other positive-electrode active material and binder resin, etc., for example.

The negative electrodes 126 are each a sheet-shaped member that contains negative-electrode material, being a current-collecting foil layered with a negative-electrode material, for example. The current-collecting foil is a porous copper foil, for example, and the negative-electrode material is a mixture of graphite or other negative-electrode active material and binder resin, etc., for example.

The separators 127 are each a sheet-shaped member made of a woven fabric, non-woven fabric, synthetic microporous resin membrane, etc., insulating a positive electrode 125 and a negative electrode 126.

The positive electrodes 125 and negative electrodes 126 are layered via the separators 127 in between, to constitute the electric storage element 121. The numbers of positive electrode 125 and negative electrode 126 layers are not limited in any way. The electric storage element 121 is housed inside the exterior members 122 together with any electrolyte solution.

The exterior members 122 seal the electric storage element 121. The exterior members 122 may each be a laminate film constituted by a metal foil whose top side and bottom side are both coated with a synthetic resin, where the synthetic resin is thermally fused along the periphery of the electric storage element 121.

It should be noted that the exterior members 122 need not be laminate films, and any members may be used so long as they can seal the electric storage element 121.

The positive-electrode terminal 123 is electrically connected to the positive electrodes 125, and led out from between the exterior members 122 to the outside. The positive-electrode terminal 123 may be a metal foil or metal sheet made of aluminum, etc. The positive-electrode terminal 123 has a hole 123a provided in it.

The negative-electrode terminal 124 is electrically connected to the negative electrodes 126, and led out from between the exterior members 122 to the outside of the exterior members 122. The negative-electrode terminal 124 may be a metal foil or metal sheet made of copper, etc. The negative-electrode terminal 124 has a hole 124a provided in it.

The electric storage cell 120 has the constitution described above. However, the electric storage cell 120 is not limited to the constitution illustrated herein; instead, it may be constituted as a lithium ion capacitor, lithium ion secondary battery, electrical double-layer capacitor, or the like, so long as it can be charged and discharged.

The housing space R can house two sets of electric storage cells 120, where each set consists of two stacked electric storage cells 120. Additionally, the number of electric storage cells 120 housed inside the housing space R is not limited, and only one electric storage cell 120 may be housed in it.

Figure 5:
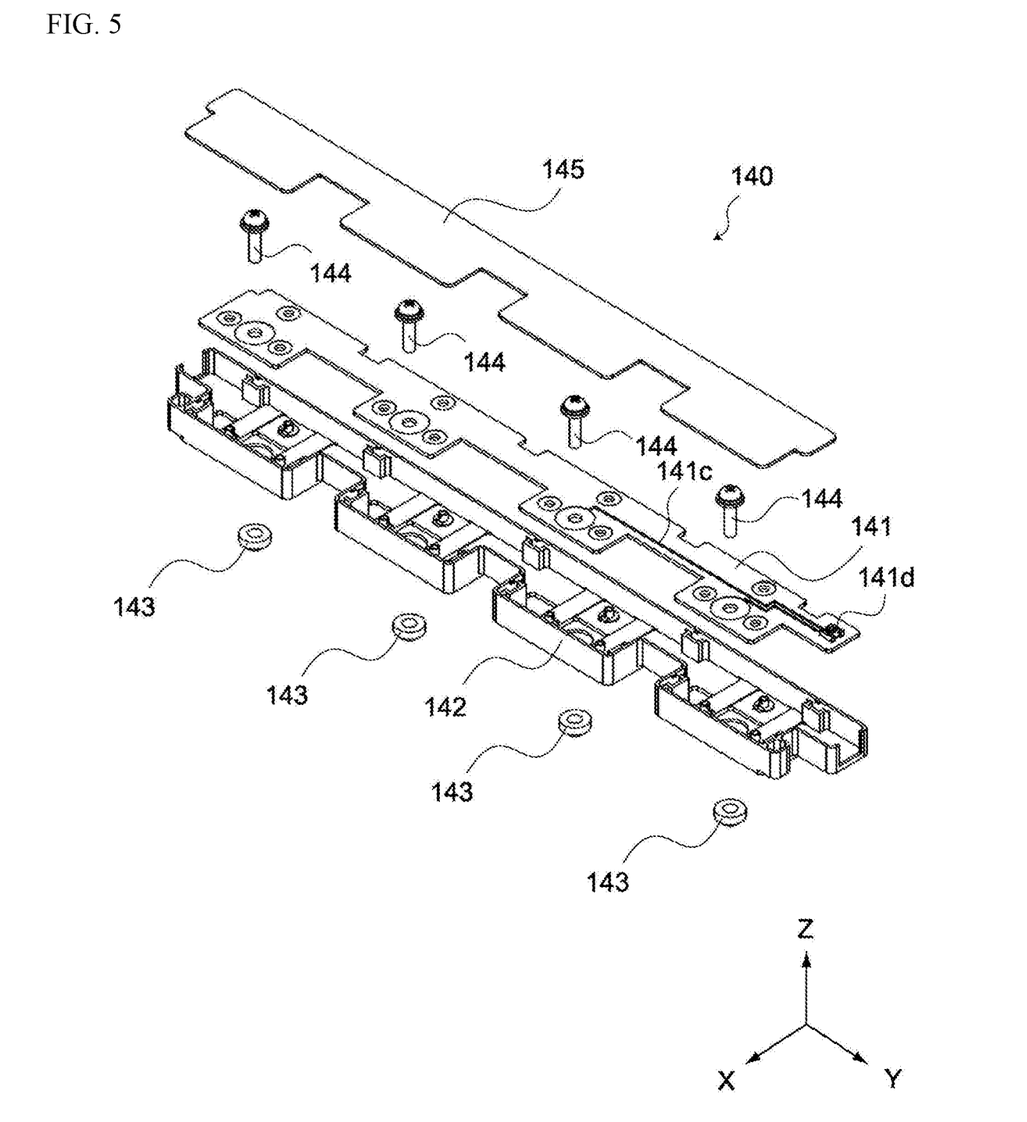
FIG. 5 is an exploded perspective view of the voltage detection unit provided in the electric storage module.
Figure 6:
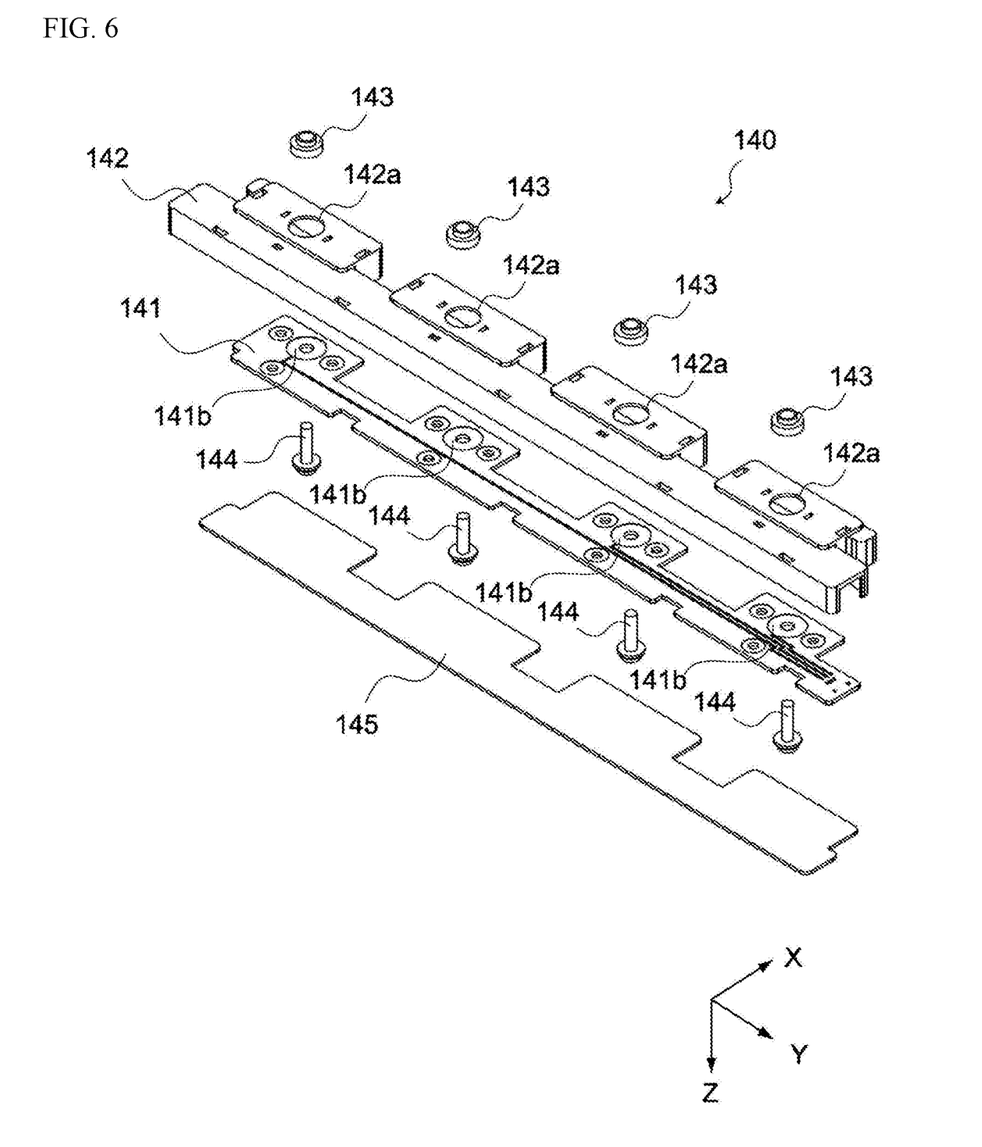
FIG. 6 is an exploded perspective view of the voltage detection unit provided in the electric storage module.

The first voltage detection unit 140 is a unit for detecting the voltages of the electric storage cells 120. FIGS. 5 and 6 are exploded perspective views of the first voltage detection unit 140, where FIG. 5 is a perspective view of the first voltage detection unit 140 from the top side, while FIG. 6 is a perspective view of the first voltage detection unit 140 from the bottom side.

As shown in these figures, the first voltage detection unit 140 comprises a voltage detection board 141, a voltage detection board holder 142, spacers 143, screws 144, and a voltage detection board holder cover 145.

Figure 7:
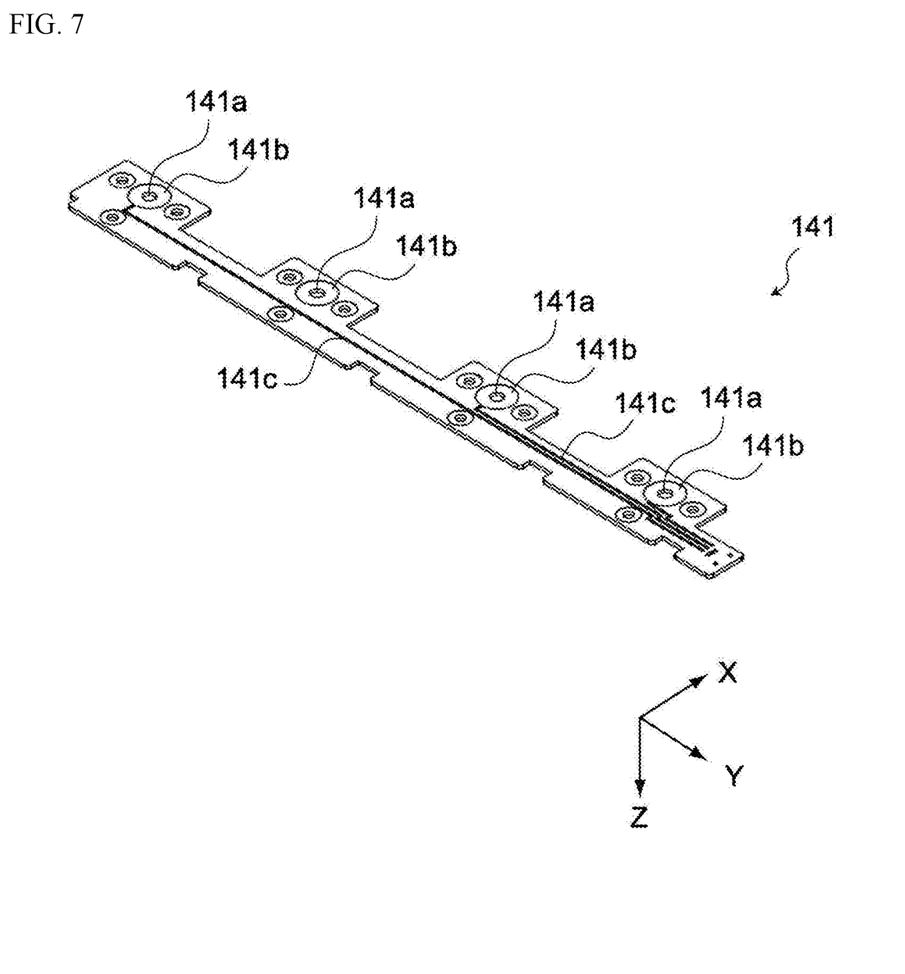
FIG. 7 is a perspective view of the voltage detection board in the voltage detection unit provided in the electric storage module.

The voltage detection board 141 electrically connects the positive-electrode terminals 123 and negative-electrode terminals 124 of the electric storage cells 120, and a control board provided in the electric storage module 100 but not illustrated. FIG. 7 is a perspective view of the voltage detection board 141. As shown in this figure, the voltage detection board 141 has holes 141a as well as lands 141b around them. The lands 141b are made of a metal or other conductive material.

Wiring 141c is provided on the top and bottom sides of the voltage detection board 141. The wiring 141c electrically connects the lands 141b and board terminals 141d (refer to FIG. 5).

The voltage detection board holder 142 is made of an insulation material and supports the voltage detection board 141. As shown in FIG. 6, the voltage detection board holder 142 has openings 142a provided in it.

The spacers 143 are made of aluminum or other conductive material, and electrically connect the positive-electrode terminal 123 and the lands 141b or electrically connect the negative-electrode terminal 124 and the lands 141b. The spacers 143 may have a ring-like shape.

The screws 144 are each inserted through the voltage detection board 141, spacer 143, voltage detection board holder 142, and positive-electrode terminal 123, or through the voltage detection board 141, spacer 143, voltage detection board holder 142, and negative-electrode terminal 124, to jointly secure them. The screws 144 may be made of a conductive material or insulation material.

Figure 8:
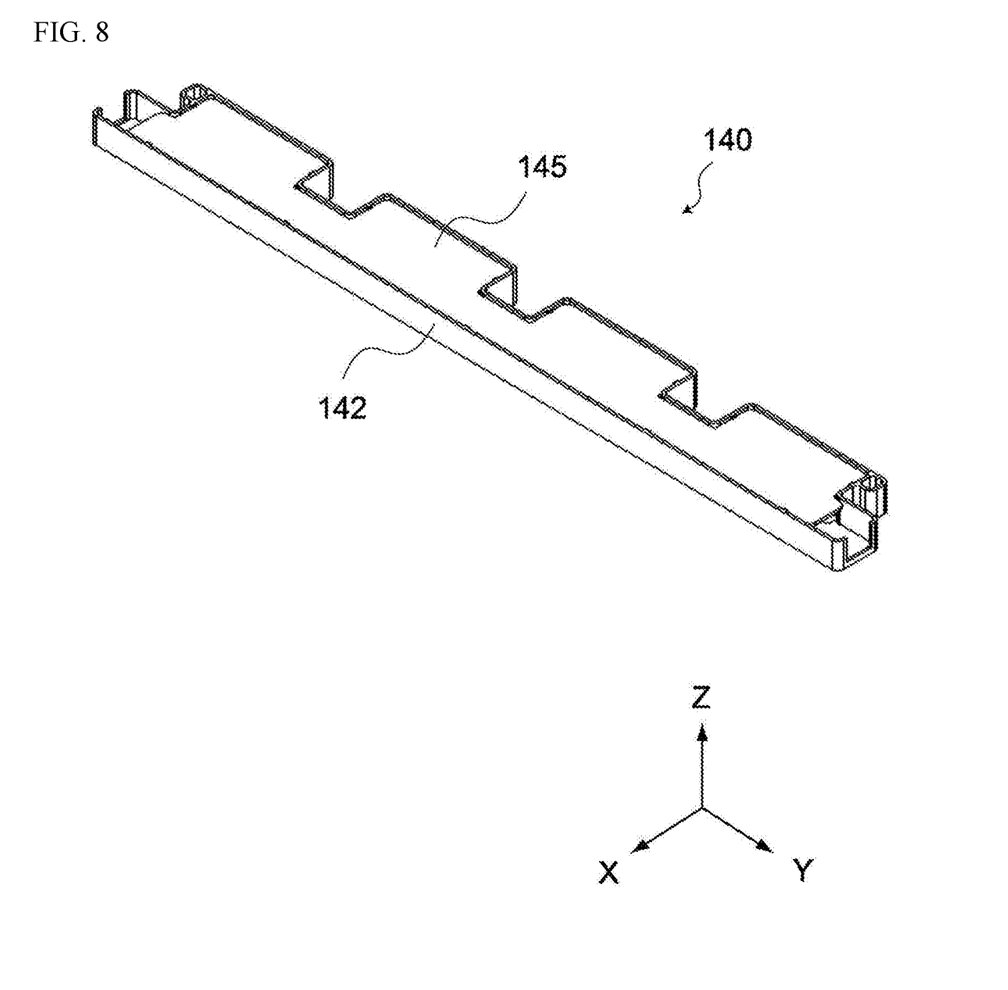
FIG. 8 is a perspective view of the voltage detection unit provided in the electric storage module.
Figure 9:
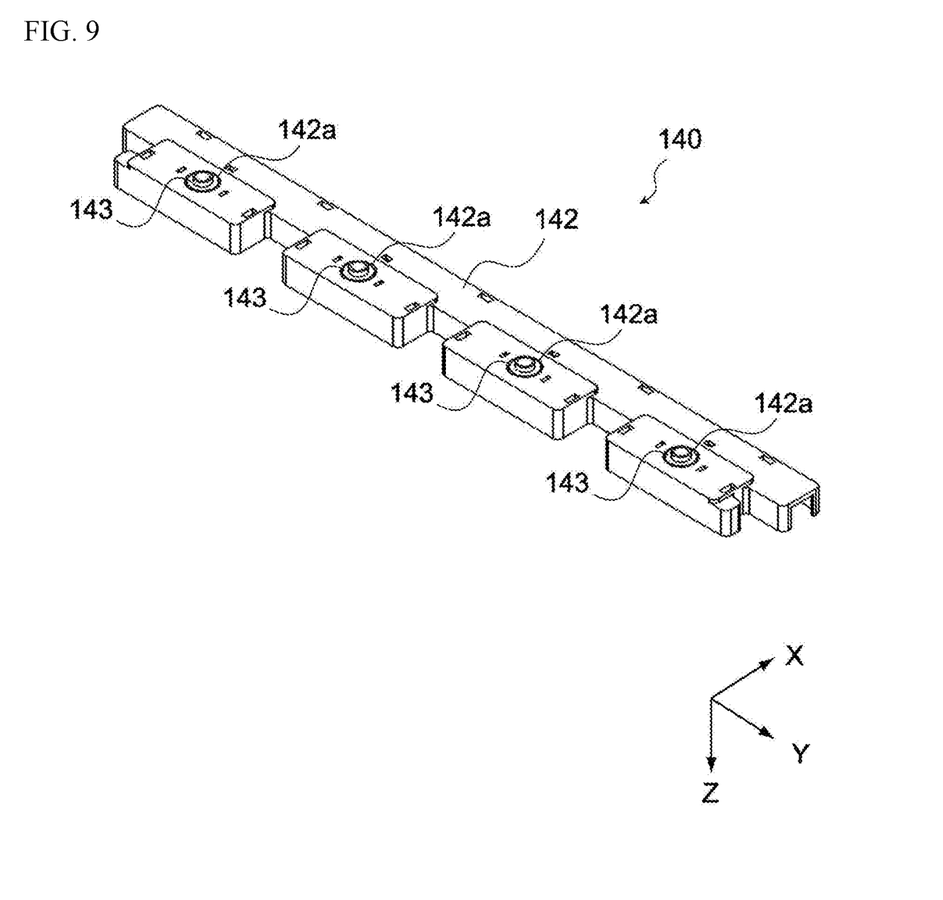
FIG. 9 is a perspective view of the voltage detection unit provided in the electric storage module.

The voltage detection board 141, voltage detection board holder 142, spacers 143, screws 144 and voltage detection board holder cover 145 are combined to constitute the first voltage detection unit 140. FIGS. 8 and 9 are perspective views of the first voltage detection unit 140, where FIG. 8 is a perspective view of the first voltage detection unit 140 from the top side, while FIG. 9 is a perspective view of the first voltage detection unit 140 from the bottom side.

The spacers 143 contact the lands 141b via the openings 142a (refer to FIG. 7), and the screws 144 are inserted through the holes 141a and the spacers 143. In this condition, these members are installed on the electric storage cells 120, after which the voltage detection board holder cover 145 is fitted into the voltage detection board holder 142.

The second voltage detection unit 150 has the same constitution as the first voltage detection unit 140; specifically, it comprises a voltage detection board 141, a voltage detection board holder 142, spacers 143, screws 144, and a voltage detection board holder cover 145.

[Mounting of Voltage Detection Boards]

Figure 10:
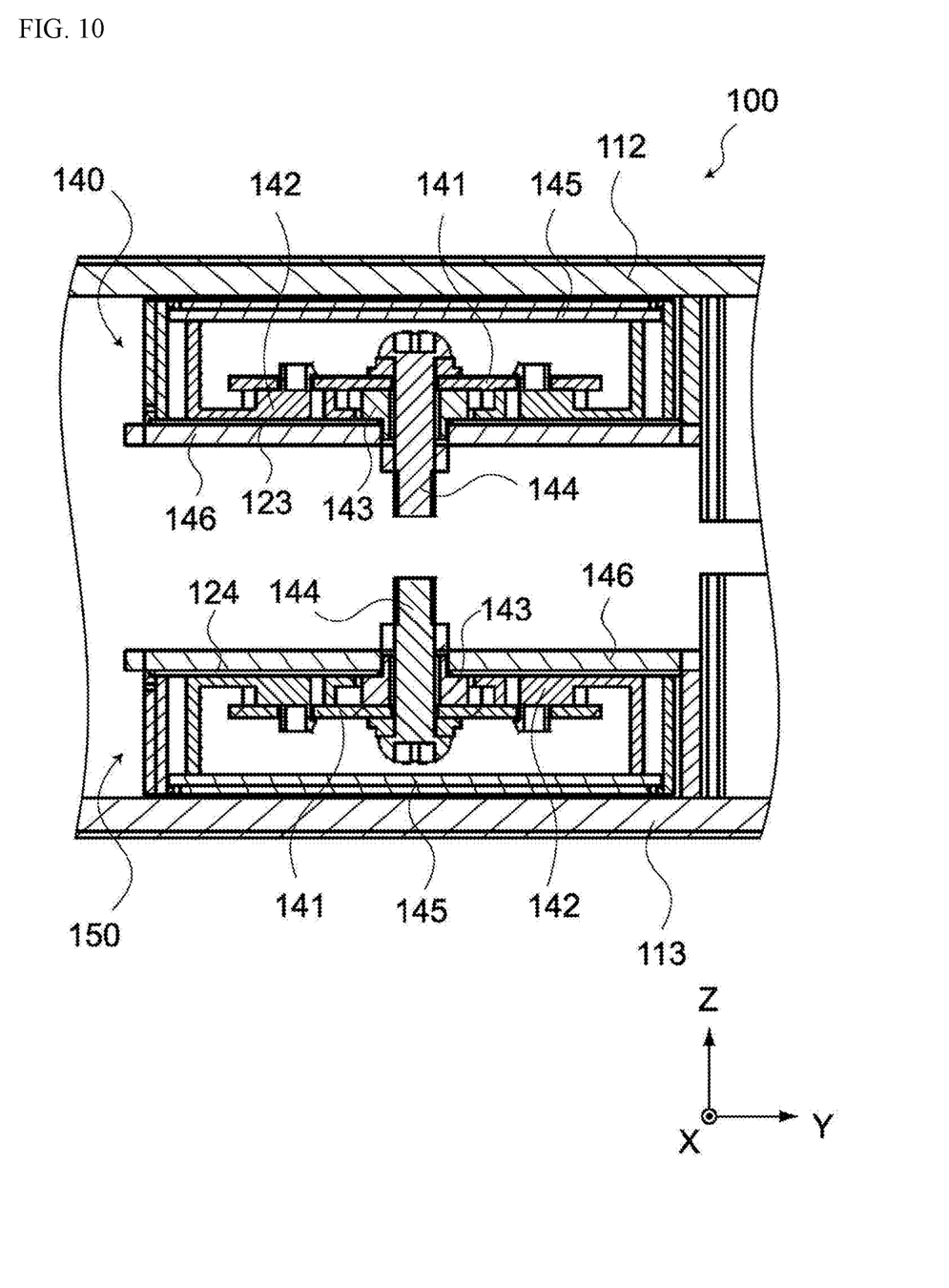
FIG. 10 is a cross-sectional view of the voltage detection unit provided in the electric storage module.

FIG. 10 is a schematic view showing a mode in which the voltage detection boards 141 are mounted. As shown in FIG. 2, the first voltage detection unit 140 and second voltage detection unit 150 are placed over the positive-electrode terminals 123 and negative-electrode terminals 124 of the electric storage cells 120.

As shown in FIG. 10, bus bars 146 are provided in the frame member 111. The bus bars 146 are each constituted by a sheet-shaped member made of an insulation material, to which a metal member is fixed. The electric storage cells 120 are placed in a manner allowing their positive-electrode terminals 123 and negative-electrode terminals 124 to contact the metal parts of the bus bars 146, respectively, and are thus electrically connected to the positive-electrode terminal and negative-electrode terminal of the electric storage module 100 via the bus bars 146.

Over the positive-electrode terminals 123 and negative-electrode terminals 124, the voltage detection board holder 142 is placed via the spacers 143. The spacers 143 contact the lands 141b on the voltage detection board 141 via the openings 142a provided in the voltage detection board holder 142.

This way, the positive-electrode terminals 123 and negative-electrode terminals 124 are electrically connected to the voltage detection board 141 via the spacers 143, and also electrically connected to the board terminals 141d via the wiring 141c (refer to FIG. 7). The board terminals 141d are connected to a control board which is not illustrated, to detect the voltage of each electric storage cell 120.

At the positive electrode, the screw 144 is inserted through the hole 141a in the voltage detection board 141, the spacer 143, the hole 123a in the positive-electrode terminal 123, and the hole 146a in the bus bar 146, to secure the members. At the negative electrode, the screw 144 is inserted through the hole 141a in the voltage detection board 141, the spacer 143, the hole 124a in the negative-electrode terminal 124, and the hole 146a in the bus bar 146, to jointly secure the members.

In other words, the first voltage detection unit 140, second voltage detection unit 150, electric storage cells 120, and bus bars 146, are jointly secured by the screws 144. Since the components are connected by the screws 144, no high machining accuracy is required of each component. In addition, there is no need to connect the voltage detection board 141 by soldering, etc., which can prevent the reliability from dropping due to the heat from soldering.

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, "a" may refer to a species or a genus including multiple species, and "the invention" or "the present invention" may refer to at least one of the embodiments or aspects explicitly, necessarily, or inherently disclosed herein. The terms "constituted by" and "having" refer independently to "typically or broadly comprising", "comprising", "consisting essentially of", or "consisting of" in some embodiments. In this disclosure, any defined meanings do not necessarily exclude ordinary and customary meanings in some embodiments.

The present application claims priority to Japanese Patent Application No. 2017-197446, filed Oct. 11, 2017, the disclosure of which is incorporated herein by reference in its entirety including any and all particular combinations of the features disclosed therein.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. An electric storage module comprising:
   an electric storage cell having an electric storage element, as well as terminals electrically connected to positive and negative electrodes of the electric storage element, respectively;
   a voltage detection board on which lands and wiring patterns electrically connected to the lands, respectively, are provided; and spacers having electrical conductivity, provided between the voltage detection board and the terminals, and contacting the respective terminals and the respective lands, wherein the voltage detection board, the spacers, and the terminals are connected by mechanical fastening, wherein the terminals are electrically connected to the wiring patterns on the voltage detection board, respectively, via the respective lands and the respective spacers, wherein the electric storage module further comprises:

a voltage detection board holder having insulation property, which is placed between the voltage detection board and the terminals, and has openings, wherein the spacers contact the terminals and the lands via the openings, respectively.

2. The electric storage module according to claim 1, wherein:

the mechanical fastening is accomplished by screws that are inserted through the voltage detection board, the respective spacers, the voltage detection board holder, and the respective terminals, to jointly secure the voltage detection board, the respective spacers, the voltage detection board holder, and the terminals.

3. The electric storage module according to claim 1, wherein:

a multiple number of electric storage cells each constituted by the electric storage cell are provided;

a multiple number of spacers constituted by the spacers are provided; and a multiple number of lands constituted by the lands are provided in the voltage detection board, wherein the spacers contact the respective terminals of the electric storage cells as well as the respective lands.

4. The electric storage module according to claim 1, wherein:

the electric storage cell is a lithium ion capacitor.

5. The electric storage module according to claim 1, wherein no soldering is used to connect the terminals, the spacers, and the voltage detection board.

* * * * *